US007215591B2

United States Patent
Vernenker et al.

(10) Patent No.: US 7,215,591 B2
(45) Date of Patent: May 8, 2007

(54) BYTE ENABLE LOGIC FOR MEMORY

(75) Inventors: Hemanshu T. Vernenker, Austin, TX (US); Margaret C. Tait, Austin, TX (US); Christopher Hume, Austin, TX (US); Allen White, Austin, TX (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 353 days.

(21) Appl. No.: 10/910,091

(22) Filed: Aug. 3, 2004

(65) Prior Publication Data

US 2006/0028897 A1    Feb. 9, 2006

(51) Int. Cl.
*G11C 8/00* (2006.01)
(52) U.S. Cl. ................ 365/230.01; 365/230.02; 365/191
(58) Field of Classification Search ........... 365/230.01, 365/230.02, 189.02, 230.03, 191, 89, 189.08
See application file for complete search history.

(56) References Cited

U.S. PATENT DOCUMENTS

| 5,369,651 A | 11/1994 | Marisetty |
| 5,406,525 A * | 4/1995 | Nicholes ................. 365/230.02 |
| 5,860,118 A | 1/1999 | Ansel et al. |
| 5,978,304 A * | 11/1999 | Crafts .................... 365/230.03 |
| 6,011,744 A * | 1/2000 | Sample et al. ......... 365/230.03 |
| 6,122,696 A | 9/2000 | Brown et al. |
| 6,591,354 B1 | 7/2003 | Mick et al. |

* cited by examiner

*Primary Examiner*—Anh Phung
*Assistant Examiner*—Dang Nguyen
(74) *Attorney, Agent, or Firm*—MacPherson Kwok Chen & Heid LLP; Greg J. Michelson

(57) ABSTRACT

Systems and methods are disclosed herein to provide techniques for writing to certain bits of a word location in a memory. For example, in accordance with an embodiment of the present invention, a method of implementing byte enable logic for a memory is disclosed, with the byte enable logic signals provided on one or more address lines.

18 Claims, 3 Drawing Sheets

BYTE ENABLE LOGIC FOR MEMORY

TECHNICAL FIELD

The present invention relates generally to electrical circuits and, more particularly, to memory and associated byte enable logic.

BACKGROUND

Memory is utilized in a variety of circuit applications to store desired information. One type of memory, for example, may be configured into different data widths (e.g., depending upon the application or data requirements). For example, a memory may have a maximum memory size of 8,192 bits and be configured with data widths of one bit (i.e., 8,192 by 1), two bits (i.e., 4,096 by 2), four bits (i.e., 2,048 by 4), eight bits (i.e., 1,024 by 8), sixteen bits (i.e., 512 by 16), or thirty two bits (i.e., 256 by 32).

A desired feature for a memory that is configurable into different data widths (e.g., wider data widths) is the ability to write to only a portion of the data width. One technique, known as byte enable logic, allows a specific byte to be written to within a wider data width block. For example, the lower eight bits may be written to instead of the entire thirty-two bit word (e.g., when configured in a 256 by 32 configuration, as in the above example). However, there may exist significant routing congestion around the memory and only a limited number of pins may be available for the memory within an integrated circuit. Consequently, it is not desirable to have dedicated byte enable signal paths to the memory and there may simply be no routing (e.g., pin) resources available to accommodate the byte enable logic signals. As a result, there is a need for improved byte enable logic techniques.

SUMMARY

Systems and methods are disclosed herein to provide techniques for writing to certain bits of a word location in a memory. For example, in accordance with an embodiment of the present invention, a method of implementing byte enable logic for a memory is disclosed, with the byte enable logic signals provided on one or more address lines. The address lines may carry address signals when the memory is configured in a narrower configuration (e.g., an eight bit word) and may carry byte enable logic signals when the memory is configured in a wider configuration (e.g., a thirty-two bit word).

More specifically, in accordance with one embodiment of the present invention, a memory includes a memory core having a plurality of memory cells, with the memory core adapted to be configured into different data widths; and at least one address line adapted to provide an address signal for addressing one or more of the plurality of memory cells, wherein the at least one address line is further adapted to provide a logic signal to control a writing of information to a certain portion of a configured data width.

In accordance with another embodiment of the present invention, an integrated circuit includes a memory having a plurality of memory cells and adapted to be configured into a plurality of data widths; a write address decoder adapted to decode address signals; a logic circuit adapted to receive at least one logic signal and control the writing to a certain portion of a configured data width based on the at least one logic signal; and a plurality of address lines, wherein one or more of the address lines are each adapted to provide one of the address signals or one of the logic signals.

In accordance with another embodiment of the present invention, a method of writing to certain bits of a word in a configurable memory includes providing address lines for carrying address signals to the memory; and providing logic for receiving a logic signal on one or more of the address lines, wherein the logic signal determines which bits of the word are being written.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Systems and methods are disclosed herein, for example, to write to a portion of a word in a configurable memory. As an example in accordance with an embodiment of the present invention, because the maximum memory size is fixed (i.e., the size of the memory array) for various memory configurations, the wider configurations do not utilize all of the address signals (or bits or signal paths). Thus, the wider the data bus width (or data word), the shallower the memory and, consequently, fewer address signals are required.

The address signals (or bits) that are unused in the wider configurations may be employed to perform a second function by serving, for example, as byte enable signals in the wider configurations. Therefore, one or more of the address bits may perform a dual function, serving as byte enable signals in wider memory configurations and serving as address signals in narrower memory configurations.

This approach provides a significant advantage of requiring fewer input signal paths to the memory, because separate input signal paths are not required for byte enable signals. With routing congestion that may occur around the memory, fewer dedicated input signal paths may provide a very desirable benefit, especially for multiport memories where the savings may increase substantially.

Figure 1:
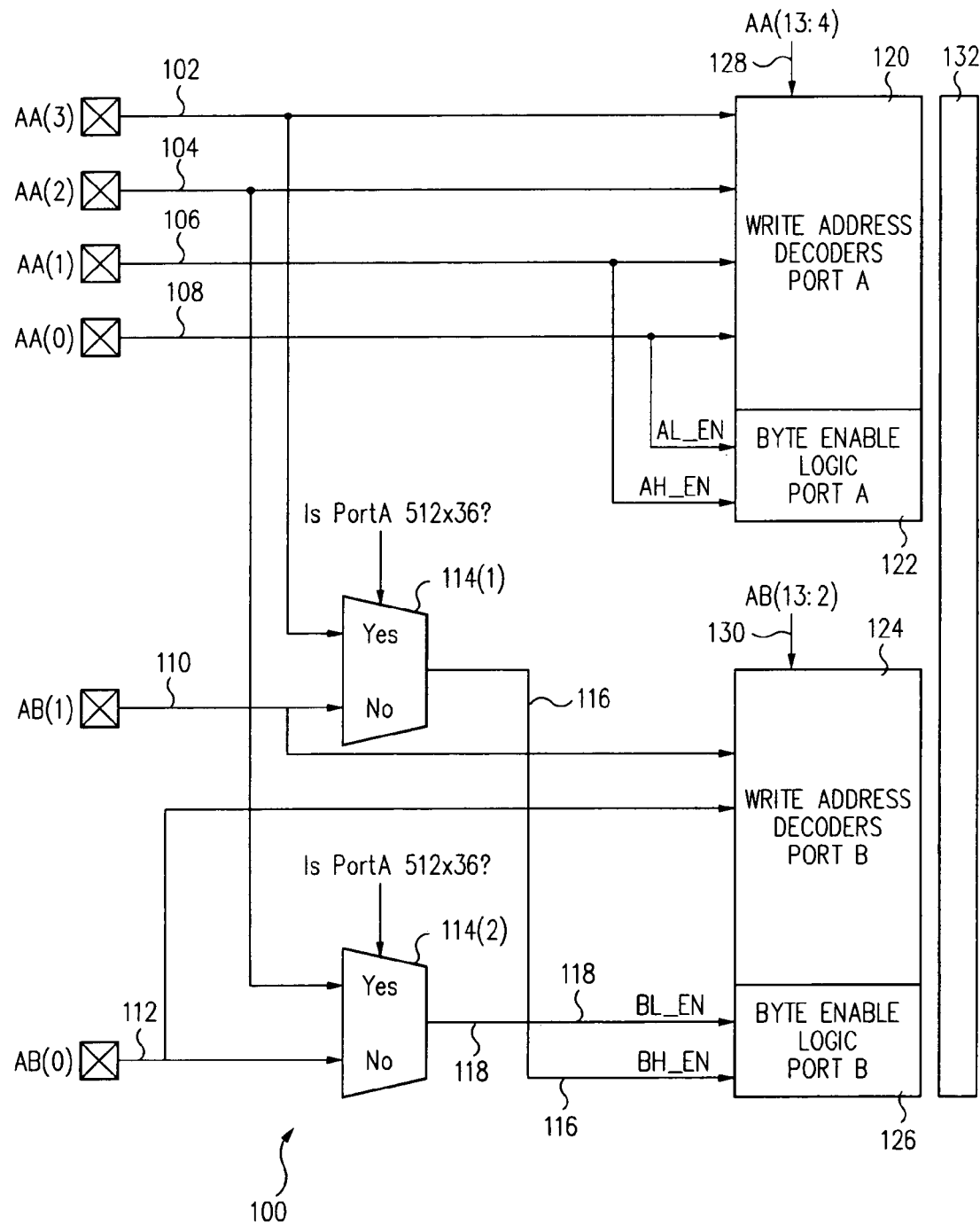
FIG. 1 shows a block diagram illustrating a memory having byte enable logic in accordance with an embodiment of the present invention.

As an exemplary implementation example, FIG. 1 shows a block diagram illustrating byte enable logic for a memory 100 in accordance with an embodiment of the present invention. Memory 100 illustrates specifically write address decoding and byte enable logic for a memory. Memory 100, as an example, may be an 18,432 bit (18 kb) dual port static random access memory (SRAM) with two ports identified as Port A and Port B. Port A and Port B each have fourteen address lines (ADDR), eighteen input data lines (DIN), and eighteen output data lines (DOUT) along with various control signals.

In this example, memory 100 (e.g., the SRAM memory) may be configured in the following six widths and depths: 1) 16,384 by 1, 2) 8,192 by 2, 3) 4,096 by 4, 4) 2,048 by 9, 5) 1,024 by 18, and 6) 512 by 36. Memory 100 can also be configured as single port, pseudo dual port, and true dual port. Port A and Port B may also be configured independently for different widths (e.g., Port A could be configured as 512 by 36 while Port B could be configured as 16,384 by 1).

For the pseudo dual port mode, Port A may be designated as the write port and Port B may be designated as the read port. For the 512 by 36 configuration, the memory may be utilized in pseudo dual port mode, but not in true dual port mode due to the data paths (e.g., the input data lines (Din) and the output data lines (DOUT)) being only eighteen bits wide). The 512 by 36 configuration pseudo dual port mode may be implemented by utilizing the read column circuits from Port A (along with the read column circuits of Port B), when performing a read through Port B, and utilizing the write column circuits from Port B (along with the write column circuits of Port A) when performing a write through Port A.

However, it should be understood that this example is not limiting and the techniques disclosed herein may be applied to a variety of memory types (e.g., dynamic random access memory (DRAM)), memory sizes (e.g., 18 Kb, 36 Kb, or 1 Mb), memory functions (e.g., first in first out (FIFO) or double data rate (DDR)), memory port types (e.g., single port, dual port, or pseudo dual port), and configurations (e.g., various width and depth memory configurations). Furthermore, the portion of the word that may be written to (rather than the entire word) may vary, depending on the application or requirements. For example, in this example in accordance with an embodiment of the present invention, byte refers to nine bits (although it may refer to eight bits or any number of bits desired, depending upon the application), with byte enable logic designating which nine bits (or multiples of nine bits, such as eighteen bits) are to be written to within the word.

Additionally, it should be understood that byte enable logic may be applied to a memory to write any number of bits within a word. For example, byte enable logic may be employed, in accordance with an embodiment of the present invention and utilizing the techniques disclosed herein, to write one, two, three, four, or more bits selectively to a data word that is wider than the bits being written.

Referring to memory 100, for memory configurations wider than nine bits (e.g., a configuration of 1,024 by 18 or 512 by 36), byte enable capability is provided for this implementation example that enables the writing of specific bytes instead of writing the entire word. For example, memory 100 (e.g., the configurable memory) includes address lines 102 through 112, 128, and 130, multiplexers 114 (separately referenced as multiplexers 114(1) and 114(2)), write address decoders 120 and 124, byte enable logic 122 and 126, and memory circuitry 132.

Address lines 102 through 112 carry address signals or byte enable signals for Port A and Port B, address lines 128 carry the remaining address lines for Port A, and address lines 130 carry the remaining address lines for Port B. For example, address lines 102 through 108 (labeled AA(3) through AA(0), respectively) are the four address lines that serve the dual purpose of providing address signals or byte enable signals for Port A (and possibly byte enable signals for Port B), depending upon the memory configuration, as described in further detail herein (e.g., in reference to Tables 1 and 2). Address lines 110 and 112 (labeled AB(1) and AB(0), respectively) are the address lines that serve the dual purpose of providing address signals or byte enable signals for Port B, depending upon the memory configuration.

Note that write address decoder 120 also receives ten additional address lines 128 (labeled AA(13:4)) and write address decoder 124 would receive twelve additional address lines 130 (labeled AB(13:2)). Therefore, for this exemplary implementation, fourteen address lines are provided for Port A and for Port B. In general, FIG. 1 illustrates the address lines and byte enable logic for writing to memory 100. Memory circuitry 132 represents, for example, the memory core (memory cells) and other associated circuitry that would conventionally be employed for a memory as is known in the art.

Memory 100 illustrates an exemplary byte enable logic block diagram for a two-port memory in accordance with an embodiment of the present invention. Because mixed width memory configurations with Port A and Port B are allowed, it is possible, for example, in a pseudo dual port mode to configure Port A for a 512 by 36 memory and Port B for a 16,384 by 1 memory. When Port B is configured as a 16,384 by 1 memory, all of the address lines for Port B (i.e., address lines 110, 112, and 130) would be required to provide addresses, with no path available to provide byte enable signals. For this case, the byte enable signals may originate from the address lines of Port A.

For example, address lines 102 through 108 provide address signals or byte enable signals for Port A and address lines 102 and 104 may also provide byte enable signals for Port B, depending upon the memory configuration. When Port A is configured as a 512 by 36 memory, multiplexer 114(1) allows through to a line 116 (labeled BH_EN) the byte enable signal carried on address line 102. Similarly, multiplexer 114(2) allows through to a line 118 (labeled BL_EN) the byte enable signal carried on address line 104. Address lines 106 (AA(1)) and 108 (AA(0)) provide byte enable signals labeled AH_EN and AL_EN, respectively, to byte enable logic 122. Tables 1 and 2 provide additional implementation details for memory 100 having byte enable logic.

Table 1 illustrates exemplary address lines and byte enable signals for different memory configurations (e.g., how the address bits are used for the different configurations) in accordance with an embodiment of the present invention. The maximum number of addresses (e.g., 14 address lines per port for this example) would be required for the deepest memory (e.g., 16,384 by 1 configuration for this example), while the minimum number of addresses (e.g., 9 address lines per port) would be required for the shallowest memory (e.g., 512 by 36 configuration). Table 1 also illustrates how the byte enable signals may be shared with the address signals for the wider memory configurations.

TABLE 1

| Memory Program Mode | Address Lines Used | Byte Enable Signals Used |
|---|---|---|
| 16384 by 1 | AA(13:0), AB(13:0) | Not Applicable |
| 8192 by 2 | AA(12:0), AB(12:0) | Not Applicable |
| 4096 by 4 | AA(11:0), AB(11:0) | Not Applicable |
| 2048 by 9 | AA(10:0), AB(10:0) | Not Applicable |

TABLE 1-continued

| Memory Program Mode | Address Lines Used | Byte Enable Signals Used |
|---|---|---|
| 1028 by 18 | AA(9:0), AB(9:0) | AA(1) to AH_EN, AA(0) to AL_EN AB(1) to BH_EN, AB(0) to BL_EN |
| 512 by 36 | AA(8:0), AB(8:0) | AA(1) to AH_EN, AA(0) to AL_EN AA(3) to BH_EN, AA(2) to BL_EN |

In Table 1, "AA" and "AB" identify address lines for port A and B, respectively, "AH_EN" and "AL_EN" control writes to bytes DiA(17:9) and DiA(8:0), respectively, and "BH_EN" and "BL_EN" control writes to bytes DiB(17:9) and DiB(8:0), respectively (e.g., as illustrated in Table 2 in further detail). AH_EN, AL_EN, BH_EN, and BL_EN refer generally to the write enabling of high and low address bytes for Ports A and B out of the maximum 36 bits for this implementation example. As an example for the 1028 by 18 configuration, address lines 106 and 108 (AA(1) and AA(0), respectively) provide byte enable signals AH_EN and. AL_EN, respectively, to byte enable logic 122 (Port A), while address lines 110 and 112 (AB(1) and AB(0), respectively) provide byte enable signals BH_EN and BL_EN, respectively, to byte enable logic 126.

Table 2 illustrates byte write enable usage in accordance with an embodiment of the present invention. In general, Table 2 shows how the byte enable signals (byte write enables) select the appropriate bytes during the write operation. As an example for the nomenclature, {BH_EN, BL_EN}={2'b11} refers to two-bit binary with {BH_EN, BL_EN} having values of (1,1), respectively, and {BH_EN, BL_EN, AH_EN, AL_EN}={4'b0011} refers to four-bit binary with {BH_EN, BL_EN, AH_EN, AL_EN} having values of (0,0,1,1), respectively.

TABLE 2

| Memory Port Width | Write Modes | Byte Write Enables | Write Data |
|---|---|---|---|
| 18 bits | 18 bits | {AH_EN, AL_EN} = {2'b11} | DiA[17:0] |
|  |  | {BH_EN, BL_EN} = {2'b11} | DiB[17:0] |
|  | 9 bits | {AH_EN, AL_EN} = {2'b01} | DiA[8:0] |
|  |  | {AH_EN, AL_EN} = {2'b10} | DiA[17:9] |
|  |  | {BH_EN, BL_EN} = {2'b01} | DiB[8:0] |
|  |  | {BH_EN, BL_EN} = {2'b10} | DiB[17:9] |
| 36 bits | 36 bits | {BH_EN, BL_EN, AH_EN, AL_EN} = {4'b1111} | DiA[35:0] (as double-wide) |
|  | 18 bits | {BH_EN, BL_EN, AH_EN, AL_EN} = {4'b0011} | DiA[17:0] |
|  |  | {BH_EN, BL_EN, AH_EN, AL_EN} = {4'b1100} | DiA[35:18] |
|  | 9 bits | {BH_EN, BL_EN, AH_EN, AL_EN} = {4'b0001} | DiA[8:0] |
|  |  | {BH_EN, BL_EN, AH_EN, AL_EN} = {4'b0010} | DiA[17:9] |
|  |  | {BH_EN, BL_EN, AH_EN, AL_EN} = {4'b0100} | DiA[26:18] |
|  |  | {BH_EN, BL_EN, AH_EN, AL_EN} = {4'b1000} | DiA[35:27] |

Figure 2:
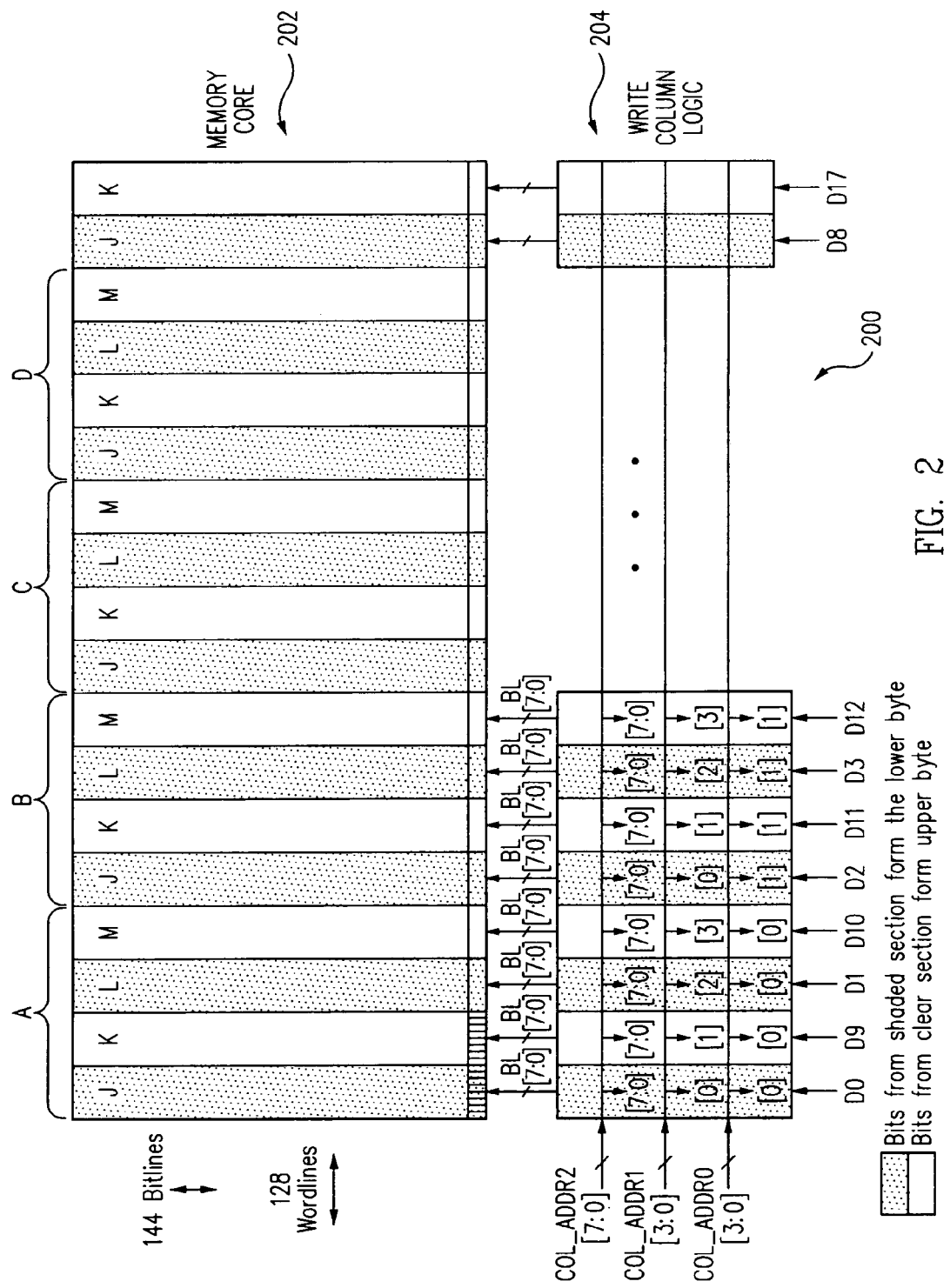
FIG. 2 shows a block diagram illustrating a portion of the memory of FIG. 1 in accordance with an embodiment of the present invention.

FIG. 2 shows a block diagram 200 illustrating a portion of memory 100 of FIG. 1 in accordance with an embodiment of the present invention. Block diagram 200 shows an exemplary implementation of the column decoding for Port A and memory core (e.g., exemplary implementation for a portion of write address decoders 120 and memory circuitry 132). A similar implementation would be implemented for Port B, but is not shown to aid in figure clarity (only Port A signals are shown in FIG. 2).

Block diagram 200 includes a memory core 202 of 18,432 bits and write column logic 204. Memory core 202 is organized as an array of 128 wordlines (rows) and 144 bitlines (columns). Because the byte enable logic does not affect the row decoding, only the column decoding is shown. Memory core 202 is divided into four major sections (labeled A, B, C, and D), with each of these sections divided into four subsections (labeled J, K, L, and M). The two additional subsections, labeled J and K and which are not within sections A, B, C, or D, provide the parity bits which are indicated as data bits eight (D[8]) and seventeen (D[17]), respectively (with this exemplary implementation having one byte comprising nine bits instead of eight bits). Each subsection includes eight bitline pairs (true and complement pairs).

Write column logic 204 is split into three groups (COL_ADDR0[3:0], COL_ADDR1[3:0], and COL_ADDR 2[7:0] signals) which include the pre-decoded column address signals (column address decoded signals). The COL_ADDR0[3:0] signals determine which section (A, B, C, or D) is selected. The COL_ADDR1[3:0] signals determine which subsection (J, K, L, or M) is selected. The COL_ADDR 2[7:0] signals determine which one of the eight bitline pairs within a subsection is selected.

The byte enable logic (i.e., byte enable logic 122) is employed to control (e.g., gate) the COL_ADDR1[3:0] signals. The bits from the higher byte and the lower byte are interleaved in memory core 202 and are represented by the highlighted subsections (i.e., subsections J and L) and the clear subsections (i.e., subsections K and M), respectively. Any data bit going into the sub-sections J or L form part of the lower byte, while any data bit going into the sub-sections K or M form part of the upper byte. The higher byte enable signal will control (gate) the COL_ADDR1[3,1] signals, while the lower byte enable signal will control (gate) the COL_ADDR1[2,0] signals (e.g., as illustrated in FIG. 3).

Figure 3:
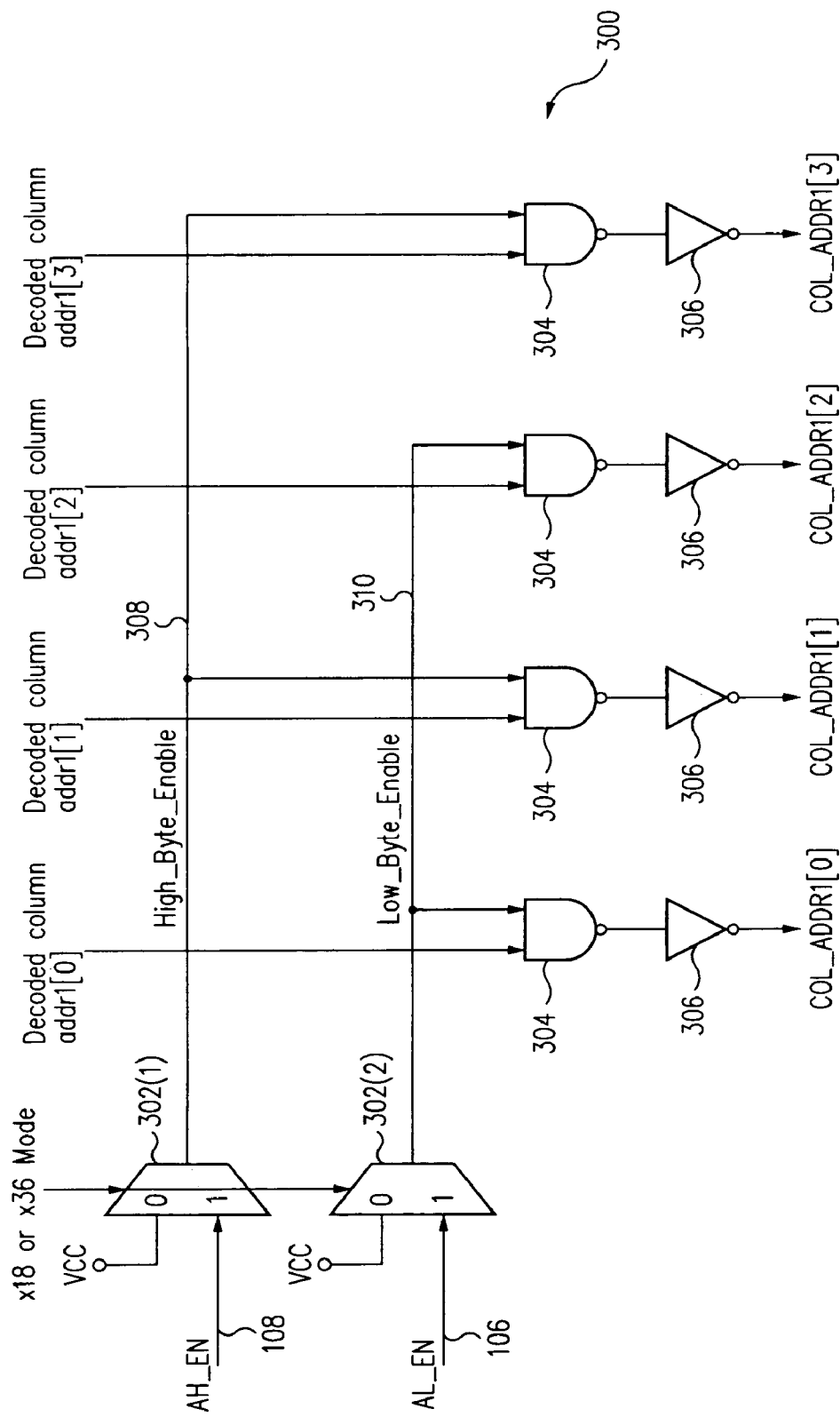
FIG. 3 shows a block diagram illustrating a portion of the memory of FIG. 1 in accordance with an embodiment of the present invention.

As an example, FIG. 3 shows a circuit 300, which is an exemplary implementation for byte enable logic 122 (Port A) of FIG. 1 in accordance with an embodiment of the present invention. Circuit 300 illustrates how the byte enable signals (AH_EN and AL_EN) control the COL_ADDR1[3:0] signals (the pre-decoded column address signals), with circuit 300 including multiplexers 302(1) and 302(2) and logic gates 304 and 306.

Because the byte enable feature is only needed for memory configurations having an input data bus width greater than nine bits (e.g., for the 1028 by 18 (×18) or 512 by 36 (×36) modes), multiplexers 302(1) and 302(2) (which form a multiplexer stage) are necessary so that in the narrower memory configurations the COL_ADDR1[3:0] signals are unaffected by the logic levels on the signal lines 308 and 310 (labeled High_Byte_Enable and Low_Byte_Enable, respectively). Consequently, for the by nine (×9) and narrower memory configurations, the signal levels on signal lines 308 and 310 are forced to a logical high (i.e., as provided by a supply voltage labeled VCC) by multiplexers 302(1) and 302(2) and hence have no effect on the COL-ADDR1[3:0] signals.

For the 1028 by 18 (×18) or 512 by 36 (×36) modes, the signal line 308 (High_Byte_Enable) and signal line 310 (Low_Byte_Enable) carry the values of byte enable signals AH_EN and AL_EN, respectively, and control the generation of the COL_ADDR1[3:0] signals. Specifically, the byte enable signal AH_EN on signal line 308 gates the COL_ADDR1[3,1] signals, while the byte enable signal AL_EN on signal line 310 gates the COL_ADDR1[2,0] signals. The COL_ADDR1[2,0] signals gate the bits of the lower byte, while the COL_ADDR1[3,1] signals gate the bits of the higher byte.

For example, if a user intends to write to the higher byte and not the lower byte in a 1028 by 18 (×18) memory configuration, then the byte enable signal AH_EN goes to a logical high, while the byte enable signal AL_EN goes to a logical low. As a result, the COL_ADDR1[3,1] signals would be asserted (i.e., fire) depending on the decoded column address (corresponding decoded column addr1[3] and decoded column addr1[1]), while the COL_ADDR1[2, 0] signals would be held to a logical low due to the byte enable signal AL_EN being held to a logical low. Thus, the sub-sections K and M would be written into, while the sub-sections J and M would not be written into (i.e., only the higher byte would be written into the memory array of memory core 202 in FIG. 2).

In accordance with one or more embodiments of the present invention, techniques are disclosed herein that are directed to memory that is configurable into different widths (e.g., different depths and widths). For example, in accordance with one embodiment of the present invention, byte enable logic is disclosed for configurations having a word or an input data bus wider than a byte (e.g., eight or nine bits, such as 2048 by 18, 512 by 36, or 256 by 72 or wider).

For example, because the maximum memory size is fixed for a given memory (e.g., size of the memory or memory array) in all of the different configurations, the wider configurations do not use all of the address bits (e.g., the wider the data bus width, the shallower the memory, and hence fewer address bits are required). Consequently, the address bits that are unused in the wider modes can perform a dual function, serving either as byte enables in the wider configurations or as address bits in the narrower configurations.

Furthermore, techniques disclosed herein in accordance with one or more embodiments of the present invention may allow fewer signal paths to the memory as compared to conventional techniques, because separate signal paths are not required for byte enable signals. These benefits may increase substantially for multiport memories. Consequently, routing congestion may be reduced due to fewer routing paths required between a memory and other circuits on the device. Additionally, one or more embodiments of the present invention may be implemented in memory where conventional techniques may fail due to insufficient routing bandwidth to accommodate the necessary additional signals (e.g., byte enable control signals).

As an example in accordance with an embodiment of the present invention, a user could choose to write to the lower 9 bits (byte) when writing into a 512 by 36 SRAM memory instead of writing the entire 36-bit word. The methods, systems, and circuits described herein, for example, may deal with byte enable designs for a memory that can be configured in different widths (e.g., for a programmable logic device, such as a field programmable gate array or a complex programmable logic device). The number of pins to the memory may be reduced (e.g., by having a signal path to carry address signals or byte enable signals), which in devices such as programmable logic devices, is advantageous due to the routing to and around the memory being heavily congested and often there are simply no routing (e.g., pin) resources to accommodate additional pins for the memory.

Embodiments described above illustrate but do not limit the invention. It should also be understood that numerous modifications and variations are possible in accordance with the principles of the present invention. Accordingly, the scope of the invention is defined only by the following claims.

We claim:
1. A memory comprising:
   a memory core having a plurality of memory cells, with the memory core adapted to be configured into different data widths; and
   at least one address line adapted to provide an address signal for addressing one or more of the plurality of memory cells, wherein the at least one address line is further adapted to provide a logic signal to control a writing of information to a certain portion of a configured data width;
   wherein the at least one address line provides the address signal when the memory core is configured with a narrow configuration for the configured data width, and provides the logic signal when the memory core is configured with a wide configuration for the configured data width.
2. The memory of claim 1, further comprising:
   a write address decoder adapted to receive the at least one address line and decode the address signal; and
   a logic circuit adapted to receive the at least one address line and control the writing of information to the memory core based on the logic signal.
3. The memory of claim 1, further comprising:
   a first port adapted for writing the information to the memory core, the first port adapted to receive at least a first one of the address lines; and
   a second port adapted for reading the information from the memory core, the second port adapted to receive at least a second one of the address lines, wherein the first one of the address lines is adapted to provide the address signal to the first port or the logic signal to the second port.
4. The memory of claim 1, further comprising byte enable logic adapted to receive the logic signal from the at least one address line and control the writing of information to one byte of the memory having a multi-byte data width for the configured data width.
5. The memory of claim 1, wherein the memory forms part of a programmable logic device.
6. The memory of claim 1, wherein the memory is configurable as a dual port memory, a single port memory, or as a pseudo dual port memory.
7. An integrated circuit comprising:
   a memory having a plurality of memory cells and adapted to be configured into a plurality of data widths;
   a write address decoder adapted to decode address signals;
   a logic circuit adapted to receive at least one logic signal and control the writing to a certain portion of a configured data width based on the at least one logic signal;
   a plurality of address lines, wherein one or more of the address lines are each adapted to provide one of the address signals or one of the logic signals;
   wherein the write address decoder, the logic circuit and the plurality of address lines are provided for a first port, the integrated circuit further comprising:
   a second write address decoder adapted to decode second address signals;
   a second logic circuit adapted to receive second logic signals and control the writing to a certain portion of the configured data width based on the second logic signals; and a plurality of second address lines, wherein one or more of the second address lines are each adapted to provide one of the second address signals or one of the second logic signals, wherein the second write address decoder, the second logic circuit and the plurality of second address lines are provided for a second port.

8. The integrated circuit of claim 7, further comprising:
a multiplexer adapted to receive one of the logic signals from one of the plurality of address lines and provide the logic signal to the second logic circuit.

9. The integrated circuit of claim 7, wherein the logic circuit provides byte enable logic.

10. The integrated circuit of claim 7, wherein the memory is adapted to be configured as a single port memory, a dual port memory, and as a pseudo dual port memory.

11. The integrated circuit of claim 7, wherein the one or more address lines each provide the address signal when the memory is configured in a narrow data width configuration for the configured data width, and provide the logic signal when the memory is configured in a wide data width configuration for the configured data width.

12. The integrated circuit of claim 7, wherein the integrated circuit is a programmable logic device.

13. A method of writing to certain bits of a word in a configurable memory, the method comprising:
providing address lines for carrying address signals to the memory; and
providing logic for receiving a logic signal on one or more of the address lines, wherein the logic signal determines which bits of the word are being written;
wherein the one or more address lines provide the logic signal when the configurable memory is configured in a wide data width configuration and provide the address signal when the configurable memory is configured in a narrow data width configuration.

14. The method of claim 13, wherein the word comprises multiple bytes and the bits of the word being written comprise one or more bytes.

15. The method of claim 13, wherein the configurable memory comprises multiple ports, the method further comprising providing the logic signal for a second port on one of the address lines for a first port when the address lines for the second port are all carrying the address signals.

16. The method of claim 13, wherein the configurable memory forms part of a programmable logic device.

17. The method of claim 13, further comprising configuring the configurable memory as a dual port memory, a single port memory, or as a pseudo dual port memory.

18. The method of claim 13, wherein the logic provides byte enable logic.

* * * * *